(12) United States Patent
Lee

(10) Patent No.: US 10,896,940 B2
(45) Date of Patent: Jan. 19, 2021

(54) TRANSPARENT DISPLAY DEVICE AND METHOD OF MANUFACTURING THE SAME

(71) Applicant: Samsung Display Co., Ltd., Yongin-si (KR)

(72) Inventor: DuckJung Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/740,494

(22) Filed: Jan. 13, 2020

(65) Prior Publication Data
US 2020/0273926 A1 Aug. 27, 2020

(30) Foreign Application Priority Data

Feb. 22, 2019 (KR) .................. 10-2019-0021366

(51) Int. Cl.
*H01L 51/52* (2006.01)
*H01L 27/32* (2006.01)
(Continued)

(52) U.S. Cl.
CPC ........ *H01L 27/3246* (2013.01); *H01L 27/323* (2013.01); *H01L 27/3276* (2013.01); *H01L 51/0016* (2013.01); *H01L 51/0018* (2013.01); *H01L 51/0097* (2013.01); *H01L 51/5225* (2013.01); *H01L 51/5228* (2013.01); *H01L 51/5281* (2013.01); *H01L 51/56* (2013.01); *H01L 2227/323* (2013.01);
(Continued)

(58) Field of Classification Search
CPC ............... H01L 27/326; H01L 27/3246; H01L 51/5234; H01L 27/3211; H01L 51/56
See application file for complete search history.

(56) References Cited

U.S. PATENT DOCUMENTS 8,835,205 B2  9/2014 Park
9,287,339 B2  3/2016 Lee et al.
(Continued)

FOREIGN PATENT DOCUMENTS

KR  10-0450516  9/2004
KR  10-1084193  11/2011
(Continued)

*Primary Examiner* — Jaehwan Oh
(74) *Attorney, Agent, or Firm* — H.C. Park & Associates, PLC

(57) ABSTRACT

A transparent display device including a base substrate and a plurality of pixels disposed on the base substrate, each pixel having an emission area and a transmission area transparent to external light, each of the pixels including a circuit element layer disposed on the base substrate, a first electrode disposed on the circuit element layer and corresponding to the emission area, a pixel define layer disposed on the circuit element layer, the pixel define layer including a first sidewall defining the emission area and a second sidewall defining the transmission area, an emission layer disposed on the first electrode and corresponding to the emission area, and a second electrode disposed on the emission layer and including an opening that corresponds to the transmission area, in which the first sidewall is inclined at a first angle, and the second sidewall is inclined at a second angle greater than the first angle.

10 Claims, 18 Drawing Sheets

(51) Int. Cl.
   *H01L 51/00*     (2006.01)
   *H01L 51/56*     (2006.01)
(52) U.S. Cl.
   CPC ............... *H01L 2251/5323* (2013.01); *H01L 2251/5338* (2013.01); *H01L 2251/558* (2013.01)

(56) References Cited

U.S. PATENT DOCUMENTS

| | | |
|---|---|---|
| 9,455,310 B2 | 9/2016 | Lee |
| 9,577,013 B2 | 2/2017 | Park |
| 9,761,647 B2 | 9/2017 | Lee et al. |
| 2016/0087017 A1* | 3/2016 | Park .................... H01L 27/3258 257/40 |
| 2017/0263895 A1* | 9/2017 | Lee ..................... H01L 27/3262 |
| 2018/0026080 A1* | 1/2018 | Lee ..................... H01L 27/3211 257/40 |
| 2019/0058020 A1* | 2/2019 | Tsai .................... H01L 27/3276 |

FOREIGN PATENT DOCUMENTS

| | | |
|---|---|---|
| KR | 10-1397110 | 5/2014 |
| KR | 10-2015-0061995 | 6/2015 |
| KR | 10-2016-0032763 | 3/2016 |

\* cited by examiner

US 10,896,940 B2

1

TRANSPARENT DISPLAY DEVICE AND METHOD OF MANUFACTURING THE SAME

CROSS REFERENCE TO RELATED APPLICATION

This application claims priority from and the benefit of Korean Patent Application No. 10-2019-0021366, filed on Feb. 22, 2019, which is hereby incorporated by reference for all purposes as if fully set forth herein.

BACKGROUND

Field

Exemplary embodiments of the invention relate generally to a transparent display device and a method of manufacturing the same, and, more specifically, to a transparent display device with an improved transmittance and a method of manufacturing the same.

Discussion of the Background

A display device is an apparatus that displays an image, and an organic light-emitting display device has recently been receiving attention. The organic light-emitting display device has excellent characteristics, such as lower power consumption, higher luminance, and quicker fast response speed than a conventional display device.

An organic light-emitting display device may include a transparent light-emitting display panel and have transparent properties. The transparent light-emitting display panel may include pixels each having a transmission area that allows light to pass therethrough. As such, users can recognize an image displayed through the pixels of the display panel, as well as perceiving objects or images behind the display panel by light passing through the transmission areas.

The above information disclosed in this Background section is only for understanding of the background of the inventive concepts, and, therefore, it may contain information that does not constitute prior art.

SUMMARY

Transparent display devices constructed according to exemplary embodiments of the invention an a method of manufacturing the same have an improved transmittance.

Additional features of the inventive concepts will be set forth in the description which follows, and in part will be apparent from the description, or may be learned by practice of the inventive concepts.

A transparent display device according to an exemplary embodiment includes a base substrate and a plurality of pixels disposed on the base substrate, each pixel having an emission area and a transmission area transparent to external light. The each pixel comprises a circuit element layer disposed on the base substrate, a first electrode disposed on the circuit element layer and corresponding to the emission area, a pixel define layer disposed on the circuit element layer, the pixel define layer including a first sidewall defining the emission area and a second sidewall defining the transmission area, an emission layer disposed on the first electrode and corresponding to the emission area, and a second electrode disposed on the emission layer and including an opening that corresponds to the transmission area.

2

The first sidewall is inclined at a first angle and the second sidewall is inclined at a second angle greater than the first angle.

A method of manufacturing a transparent display device including a plurality of pixels each having an emission area and a transmission area that is transparent to external light according to another exemplary embodiment includes the steps of forming a circuit element layer on a top surface of a base substrate, forming a first electrode corresponding to the emission area on the circuit element layer, forming a pixel define layer defining the emission area and the transmission area on the circuit element layer, forming a preliminary organic layer corresponding to the emission area and the transmission area on the first electrode, forming an electrode layer covering the preliminary organic layer, heating up a portion of the preliminary organic layer disposed on the transmission area to separate the portion of the preliminary organic layer from the circuit element layer, and removing the portion of the preliminary organic layer separated from the circuit element layer and a portion of the electrode layer to form an organic layer and a second electrode, each of the organic layer and the second electrode having an opening corresponding to the transmission area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
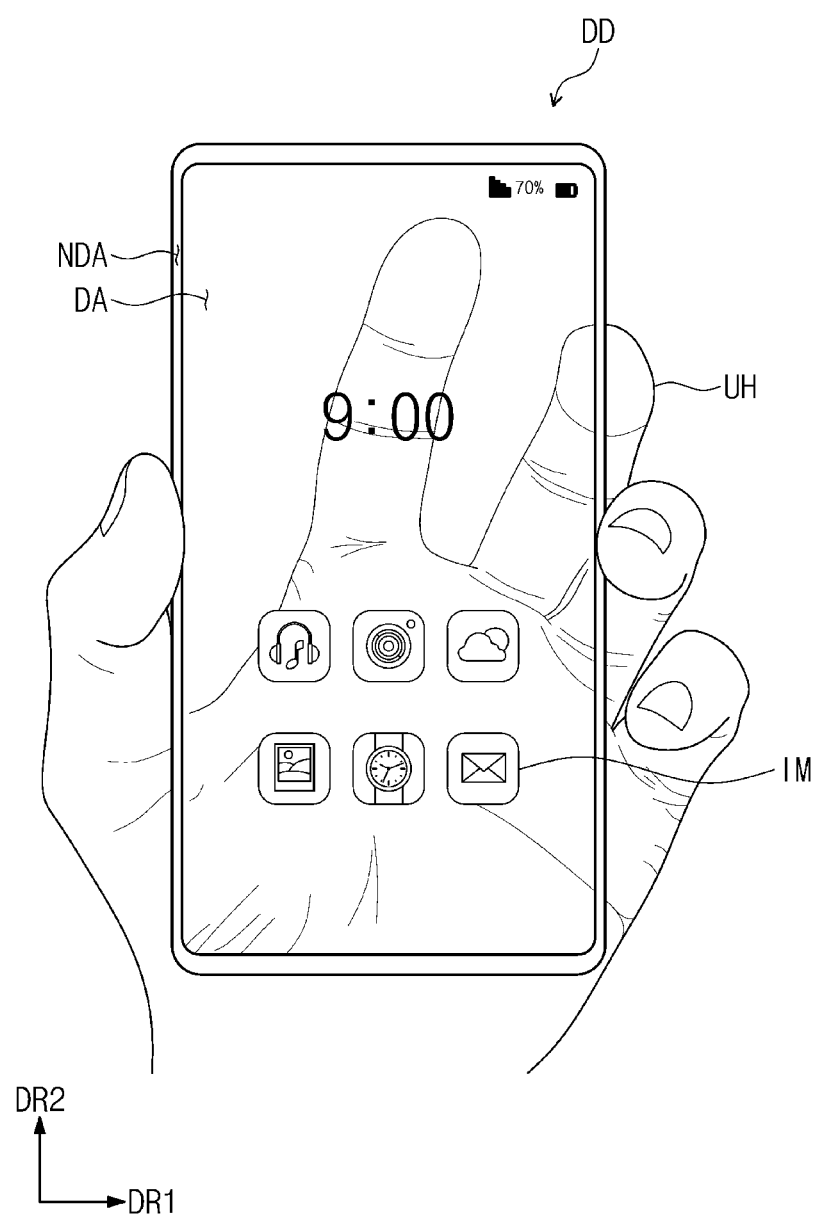
FIG. 1 is a front view of a transparent display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
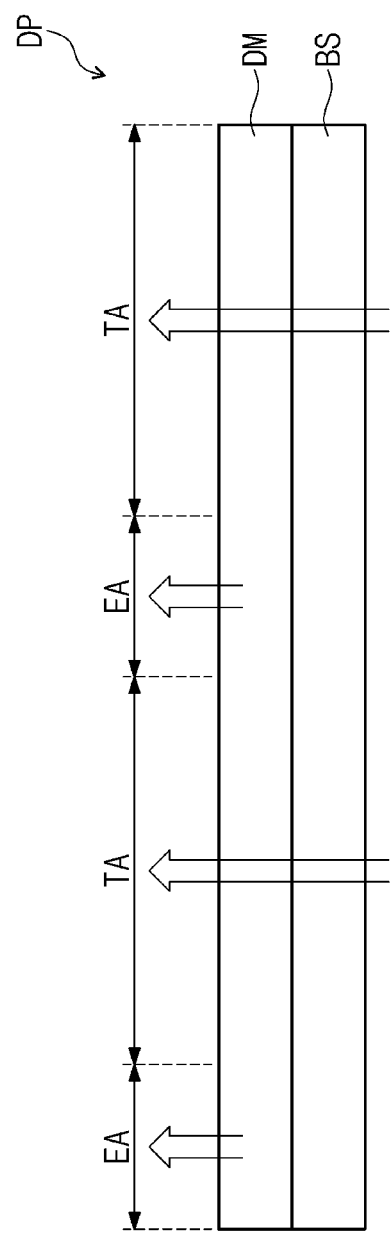
FIG. 2 is a cross-sectional view exemplarily showing a transparent display device according to an exemplary embodiment.
Figure 3:
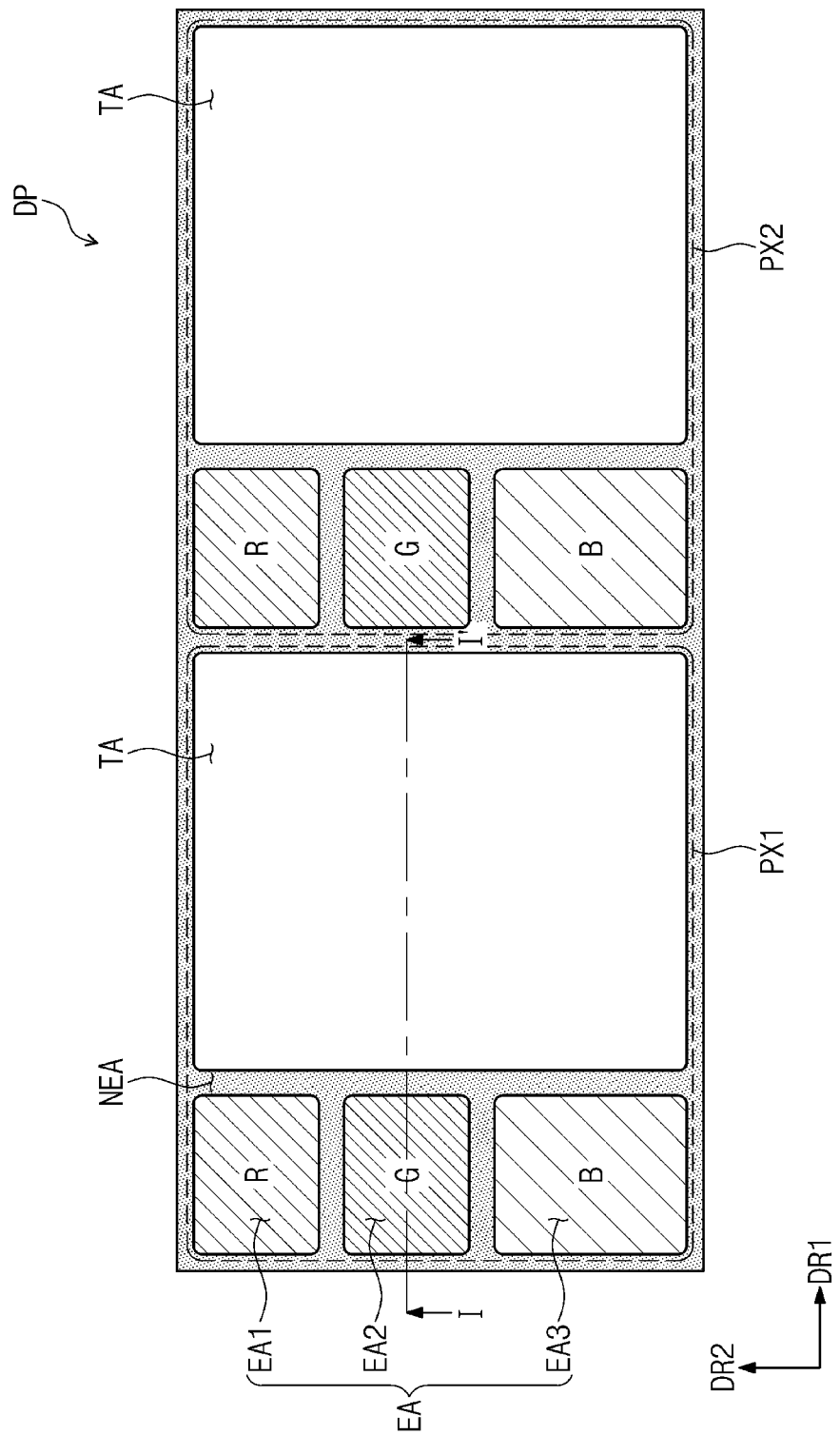
FIG. 3 is a plan view of a pixel structure of a transparent display panel according to an exemplary embodiment.

FIG. 1 is a front view of a transparent display device according to an exemplary embodiment. FIG. 2 is a cross-sectional view exemplarily illustrating a transparent display device according to an exemplary embodiment. FIG. 3 is a plan view of a pixel structure of a transparent display panel according to an exemplary embodiment.

Referring to FIG. 1, a transparent display device DD may have a display area DA and a non-display area NDA defined thereon. The display area DA, on which an image IM is displayed, may be parallel to a plane defined by a first direction DR1 and a second direction DR2 intersecting the first direction DR1. In some exemplary embodiments, the first direction DR1 may be parallel to a short side of the transparent display device DD, and the second direction DR2 may be parallel to a long side of the transparent display device DD.

A user may recognize the image IM displayed on the display area DA, and may further recognize an object or image behind the transparent display device DD. FIG. 1 exemplarily illustrates that the transparent display device DD displays a user's hand UH positioned on a backside thereof.

The transparent display device DD may be used for large-sized electronic apparatuses, such as televisions, monitors, and outdoor billboards, and may also be used for small- and medium-sized electronic apparatuses, such as personal computers, laptop computers, personal digital terminals, automobile navigation units, game consoles, portable electronic devices, and cameras. However, the inventive concepts are not limited thereto, and the transparent display device DD may be adopted for various other electronic apparatuses.

The non-display area NDA is a region that adjoins the display area DA and may not display an image IM. The non-display area NDA may define a bezel region of the transparent display device DD. An object or image behind the non-display area NDA of the transparent display device DD may not be recognized.

The non-display area NDA may surround the display area DA. Alternatively, the non-display area NDA may be partially adjacent to an edge of the display area DA or may be omitted. However, the inventive concepts are not limited thereto.

Referring to FIGS. 1 and 2, the transparent display device DD may include a transparent display panel DP. The transparent display panel DP may be a flexible display panel. For example, the transparent display panel DP may be flexible, and thus, the shape thereof may be changed by bending, folding, rolling, etc. In some exemplary embodiments, the transparent display panel DP may be an organic light-emitting display panel including an organic light-emitting device.

The transparent display panel DP may include a base substrate BS and a display unit DM provided on the base substrate BS. The display unit DM may include a light-emitting layer that emits internal light. The light-emitting layer may be provided to correspond to an emission area EA. As such, the transparent display panel DP may display an image through a plurality of emission areas EA. The transparent display panel DP may allow external light to pass through a transmission area TA. Accordingly, the transparent display panel DP may show an object or image positioned on the backside thereof, while displaying an image through the emission area EA.

The display unit DM may be provided with various devices and connection lines corresponding to the emission area EA, and thus, external light incident onto the emission area EA may have an extremely low transmittance or may hardly pass through the emission area EA. However, the various devices and connection lines may not correspond to the transmission area TA, which may increase transmittance of external light in the transmission area TA.

Although FIG. 2 shows a structure in which the transmission area TA is provided directly adjacent to the emission area EA, in some exemplary embodiments, a non-emission area (e.g., NEA of FIG. 3) may further be provided between the emission area EA and the transmission area TA.

Referring to FIG. 3, the transparent display panel DP may include a plurality of pixels. Each of the plurality of pixels may include an emission area EA, a non-emission area NEA, and a transmission area TA. FIG. 3 shows two neighboring pixels PX1 and PX2 among the plurality of pixels. The two pixels PX1 and PX2 may have substantially the same configuration as each other. In addition, each of the pixels may have substantially the same configuration.

Each of the pixels PX1 and PX2 may include a plurality of sub-pixels. The emission area EA may include a plurality of emission areas EA1, EA2, and EA3 that respectively correspond to the plurality of sub-pixels. The transmission area TA may be disposed adjacent to the plurality of emission areas EA1, EA2, and EA3.

According to the illustrated exemplary embodiment, each pixel may include a first sub-pixel that displays a red color R, a second sub-pixel that displays a green color G, and a third sub-pixel that displays a blue color B. The first to third sub-pixels may have substantially the same size, or at least one of the first to third sub-pixels may have a different size from those of other sub-pixels. As illustrated in FIG. 3, the third sub-pixel may have a size greater than those of the first and second sub-pixels. In this case, the third emission area EA3 corresponding to the third sub-pixel may have a size greater than those of the first and second emission areas EA1 and EA2 corresponding to the first and second sub-pixels, respectively.

The transmission area TA may have a size greater than a sum of the first to third sub-pixels. However, the inventive concepts are not limited thereto, and in some exemplary embodiments, the size of the transmission area TA may be variously changed based on a desired transmittance of the transparent display device DD.

FIG. 3 illustrates that each of the pixels PX1 and PX2 has one transmission area TA, however, the inventive concepts are not limited thereto. In some exemplary embodiments, each of the pixels PX1 and PX2 may have a plurality of transmission areas TA. For example, each pixel may include two or more transmission areas that respectively correspond to the first to third sub-pixels.

FIG. 3 shows that each of the emission areas EA1, EA2, and EA3 has a substantially rectangular shape defined by the first and second directions DR1 and DR2. However, the inventive concepts are not limited thereto. For example, each of the emission areas EA1, EA2, and EA3 may have a substantially rhombohedral shape. The transmission area TA is also illustrated to have a substantially rectangular shape defined by the first and second directions DR1 and DR2, but the shape of the transmission area TA may be changed based on each shape of the emission areas EA1, EA2, and EA3.

The transparent display device DD shown in FIGS. 1 to 3 is illustrated as having a structure in which each of the pixels PX1 and PX2 is provided with the transmission area TA, but the inventive concepts are not limited thereto. For example, the display area DA of the transparent display device DD in some exemplary embodiments may be partially constructed as a transparent display region. In this case, the transmission area TA may be provided on pixels disposed on the transparent display region, and pixels disposed in regions other than the transparent display region may not include the transmission area TA. In this manner, on the transparent display region, the emission area EA may display an image and the transmission area TA may display an object or external image behind the transparent display device DD, but on other display regions, only the emission area EA may display an image.

Figure 4:
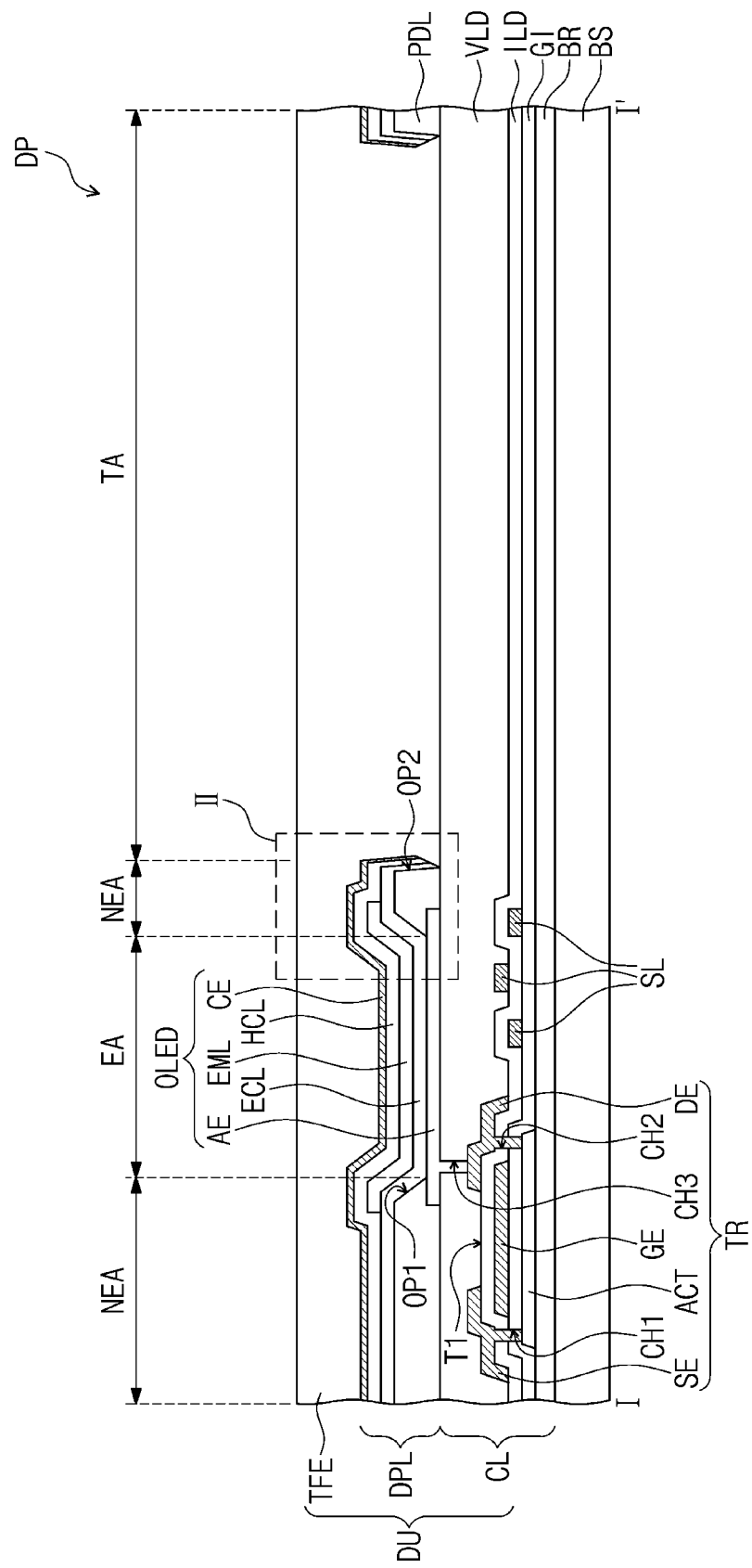
FIG. 4 is a cross-sectional view taken along line I-I' of FIG. 3, showing a display element layer of the transparent display panel of FIG. 3.
Figure 5:
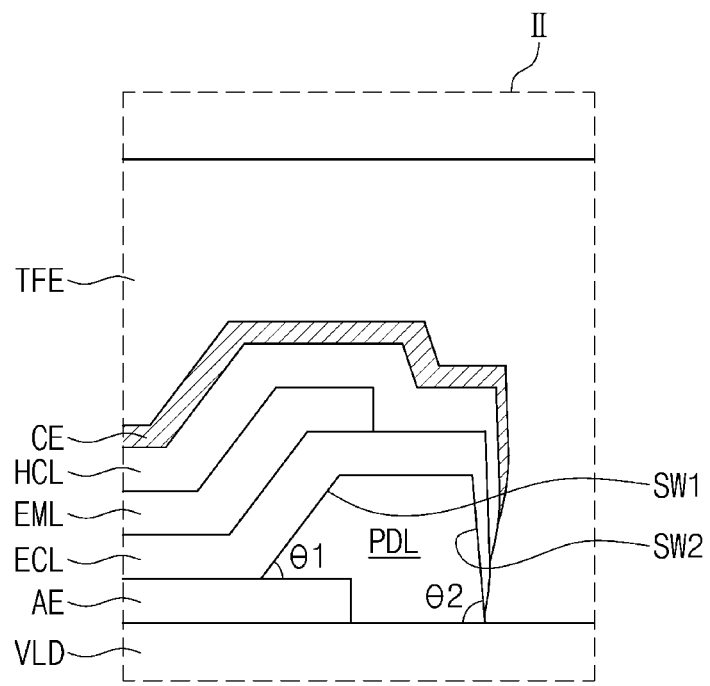
FIG. 5 is an enlarged view showing section II of FIG. 4.

FIG. 4 is a cross-sectional view taken along line I-I' of FIG. 3, showing a display element layer of the transparent display panel of FIG. 3. FIG. 5 illustrates an enlarged view of section II of FIG. 4.

Referring to FIGS. 4 and 5, the transparent display panel DP may include a base substrate BS and a display unit DU, which may include a circuit element layer CL, a display element layer DPL, and an encapsulation layer TFE. In some exemplary embodiments, the display unit DU may further include one or more of a touch sensor, anti-reflection layer, and a window.

The base substrate BS may be a silicon substrate, a plastic substrate, a glass substrate, a dielectric film, or a stack structure including a plurality of dielectric layers.

The circuit element layer CL may include a sub-pixel circuit provided on each sub-pixel and a plurality of signal lines SL connected to the sub-pixel circuit. The sub-pixel circuit may include a plurality of transistors TR and a capacitor. FIG. 4 exemplarily shows one transistor TR, but the inventive concepts are not limited to a particular number and structure of the transistor TR. The circuit element layer CL may include a barrier layer BR, an active layer ACT, a gate insulating layer GI, a gate electrode GE, an interlayer insulating layer ILD, an input electrode SE, an output electrode DE, and an intermediate insulating layer VLD.

The barrier layer BR may be disposed on the base substrate BS and may prevent foreign substances from infiltrating onto the barrier layer BR. In some exemplary embodiments, the display unit DU may further include a buffer layer on the barrier layer BR. The buffer layer may increase bonding strength between the base substrate BS and layers disposed on the base substrate BS. The barrier layer BR and the buffer layer may be optionally disposed or omitted.

The active layer ACT may be disposed on the barrier layer BR. The active layer ACT may serve as a channel region of the transistor TR. The active layer ACT may include one selected from amorphous silicon, polysilicon, and oxide semiconductor.

The gate insulating layer GI may be disposed on the active layer ACT. The gate insulating layer GI may insulate the gate electrode GE from the active layer ACT.

The gate electrode GE may be disposed on the gate insulating layer GI. The gate electrode GE may be placed to overlap the active layer ACT. A first conductive layer forming the signal lines SL may be disposed at the same level as that of the gate electrode GE.

The interlayer insulating layer ILD may be disposed on the gate electrode GE. The interlayer insulating layer ILD may electrically insulate the gate electrode GE from the input and output electrodes SE and DE. The interlayer insulating layer ILD may include an inorganic material. The inorganic material may include silicon nitride, silicon oxynitride, silicon oxide, or the like.

The input and output electrodes SE and DE may be disposed on the interlayer insulating layer ILD. Each of the input and output electrodes SE and DE may be electrically connected to the active layer ACT through a corresponding one of first and second contact holes CH1 and CH2 provided in the interlayer insulating layer ILD and the gate insulating layer GI. A second conductive layer forming the signal lines SL may be disposed at the same level as that of the input and output electrodes SE and DE.

The transparent displayer panel DP according to the illustrated exemplary embodiment is described as having a top-gate structure, in which the gate electrode GE is disposed above the active layer ACT, but the inventive concepts are not limited thereto. In some exemplary embodiments, the transparent display panel DP may have a bottom-gate structure, in which the gate electrode GE is disposed beneath the active layer ACT. In yet other exemplary embodiments, the transparent display panel DP may include one of a plurality of transistors TR having the top-gate structure and another one of the plurality of transistors TR having the bottom-gate structure.

The intermediate insulating layer VLD may be disposed on the input and output electrodes SE and DE. The intermediate insulating layer VLD may provide a planarized surface. The intermediate insulating layer VLD may include an organic material. The organic material may include one or more of acryl-based resin, methacryl-based resin, vinyl-based resin, epoxy-based resin, urethane-based resin, cellulose-based resin, siloxane-based resin, polyimide-based resin, polyamide-based resin, and perylene-based resin.

The display element layer DPL may be disposed on the intermediate insulating layer VLD. The display element layer DPL may include a pixel define layer PDL and a plurality of display elements OLED. The plurality of display elements OLED may be correspondingly provided on the plurality of sub-pixels, and may be connected to corresponding sub-pixel circuits or signal lines SL. In some exemplary embodiments, the display element OLED may be an organic light-emitting diode. The display element OLED may include a first electrode AE, a first organic layer HCL, an emission layer EML, a second organic layer ECL, and a second electrode CE.

The first electrode AE may be disposed on the intermediate insulating layer VLD. The first electrode AE may be connected to the output electrode DE through a third contact hole CH3 penetrating the intermediate insulating layer VLD. The first electrode AE may be a reflective electrode, without being limited thereto. For example, in some exemplary embodiments, the first electrode AE may be a transmissive electrode or a transflective electrode. When the first electrode AE is a transflective or reflective electrode, the first electrode AE may include Ag, Mg, Cu, Al, Pt, Pd, Au, Ni, Nd, Ir, Cr, Li, Ca, LiF/Ca, LiF/Al, Mo, Ti, or any compound or mixture thereof (e.g., a mixture of Ag and Mg). Alternatively, the first electrode AE may have a multi-layered structure including a reflective or transflective layer formed of the material mentioned above, and a transparent conductive layer formed of indium tin oxide (ITO), indium zinc oxide (IZO), zinc oxide (ZnO), indium tin zinc oxide (ITZO), or the like. For example, the first electrode AE may be a multi-layered metal layer having a stacked structure of ITO/Ag/ITO.

In particular, when the first electrode AE is formed as a reflective electrode, the first electrode AE may prevent external light from passing through the emission area EA, and thus, suppress image distortion caused by the external light.

The pixel define layer PDL may include an organic material. The pixel define layer PDL is provided with a first opening OP1 defined corresponding to the emission area EA. The first opening OP1 of the pixel define layer PDL exposes at least a portion of the first electrode AE. The pixel define layer PDL is provided with a second opening OP2 defined corresponding to the transmission area TA. The second opening OP2 of the pixel define layer PDL partially exposes a top surface of the circuit element layer CL.

The transparent display panel DP may be provided with the emission area EA and the non-emission area NEA adjacent to the emission area EA. The non-emission area NEA may surround the emission area EA. In some exemplary embodiments, the emission area EA may correspond to a portion of the first electrode AE exposed by the first opening OP1.

The first organic layer ECL may be an electron control layer. The first organic layer ECL may be disposed in common on the emission area EA and the non-emission area NEA. In some exemplary embodiments, a common layer, such as the first organic layer ECL, may be formed in common on a plurality of display elements OLED. In some exemplary embodiments, the first organic layer ECL may include one or more of an electron injection layer and an electron transport layer.

The emission layer EML is disposed on the first organic layer ECL. The emission layer EML may be disposed on a region corresponding to the first opening OP1. For example, the emission layer EML may be separately formed on each of the plurality of display elements OLED. The emission layer EML may include an organic material well known in the art. For example, the emission layer EML may be formed of one or more of a material emitting a red color, a material emitting a green color, and a material emitting a blue color, and may include a fluorescent or phosphorescent material.

FIG. 4 exemplarily shows a patterned emission layer EML, but the emission layer EML may be disposed in common on a plurality of display elements OLED. When the emission layer EML is disposed in common on a plurality of display elements OLED, the emission layer EML may produce white light. The emission layer EML may have a single-layered structure made of a single material, a single-layered structure including a plurality of different materials, or a multiple-layered structure including a plurality of layers made of different materials.

The second organic layer HCL may be disposed on the emission layer EML. In some exemplary embodiments, the second organic layer HCL may be formed in common on a plurality of display elements OLED. The second organic layer HCL may be a hole control layer. The second organic layer HCL may include one or more of a hole injection layer and a hole transport layer.

The second electrode CE is disposed on the second organic layer HCL. The second electrode CE is placed in common on a plurality of display elements OLED. The second electrode CE may be formed of Ag, Mg, Al, Pt, Pd, Au, Ni, Nd, Ir, Cr, Li, Ca, or the like, but may be preferably formed of Mg or an alloy thereof. The second electrode CE may have a thickness of about 35 Å to about 80 Å.

Each of the first and second organic layers ECL and HCL has an open structure corresponding to the transmission area TA. In addition, the second electrode CE may have the shape of an open structure corresponding to the transmission area TA. For example, the first and second organic layers ECL and HCL may be removed from locations corresponding to the transmission area TA, and the second electrode CE may be removed from a location corresponding to the transmission area TA. In this manner, on the transmission area TA, the top surface of the circuit element layer CL may not be covered with but exposed by the first and second organic layers ECL and HCL and the second electrode CE.

The encapsulation layer TFE encapsulates the display element layer DPL. The encapsulation layer TFE is disposed on the second electrode CE. The encapsulation layer TFE is placed in common on a plurality of display elements OLED. In some exemplary embodiments, the encapsulation layer TFE directly covers the second electrode CE. In other exemplary embodiments, a capping layer covering the second electrode CE may be disposed between the encapsulation layer TFE and the second electrode CE. In this case, the encapsulation layer TFE may directly cover the capping layer. The encapsulation layer TFE may directly cover the top surface of the circuit element layer CL exposed in the transmission area TA.

The encapsulation layer TFE includes at least one inorganic layer (hereinafter, referred to as an encapsulation inorganic layer). The encapsulation layer TFE may further include at least one organic layer (hereinafter, referred to as an encapsulation organic layer). The encapsulation inorganic layer protects the display element layer DPL against moisture/oxygen, and the encapsulation organic layer protects the display element layer DPL against impurities, such as dust particles. The encapsulation inorganic layer may include a silicon nitride layer, a silicon oxynitride layer, a silicon oxide layer, a titanium oxide layer, an aluminum oxide layer, or the like. The encapsulation organic layer may include an acryl-based inorganic layer, without being limited thereto.

As illustrated in FIGS. 4 and 5, the non-emission area NEA is defined between the emission area EA and the transmission area TA, and the pixel define layer PDL is positioned on the non-emission area NEA. The pixel define layer PDL may include a first sidewall SW1 defining the emission area EA and a second sidewall SW2 defining the transmission area TA. For example, the first sidewall SW1 is disposed adjacent to the emission area EA, and the second sidewall SW2 is disposed adjacent to the transmission area TA. Each of the first and second sidewalls SW1 and SW2 has an inclined structure. For example, the first sidewall SW1 has an inclined structure sloped at a first angle $\theta 1$, and the second sidewall SW2 has an inclined structure sloped at a second angle $\theta 2$. The first and second angles $\theta 1$ and $\theta 2$ have different magnitudes from each other. In some exemplary embodiments, the first angle $\theta 1$ may have a magnitude greater than 0° and equal to or less than about 30°, and the second angle $\theta 2$ may have a magnitude greater than about 30° and less than about 90°.

Among a plurality of layers forming the display elements OLED, each of the first electrode AE and the emission layer EML may be separately provided on a corresponding emission area EA. However, each of the first organic layer ECL, the second organic layer HCL, and the second electrode CE may be disposed in common on the emission area EA and the non-emission area NEA. In some exemplary embodiments, each of the first organic layer ECL, the second organic layer HCL, and the second electrode CE may be formed in common on a plurality of emission areas EA, for example, on the first, second, and third emission areas (see EA1, EA2, and EA3 of FIG. 3). Hereinafter, the layers ECL, HCL, and CE commonly formed on a plurality of emission areas EA may collectively be referred to as a common layer.

The first electrode AE and the emission layer EML may be disposed to overlap the first sidewall SW1, and the common layer ECL, HCL, and CE may be disposed to overlap the first and second sidewalls SW1 and SW2. Since the first sidewall SW1 is sloped at the first angle $\theta 1$ and the second sidewall SW2 is sloped at the second angle $\theta 2$ greater than the first angle $\theta 1$, a thickness of a portion of the common layer ECL, HCL, and CE overlapping the first sidewall SW1 may be different from a thickness of a portion of the common layer ECL, HCL, and CE overlapping the second sidewall SW2. For example, the thickness of the portion of the common layer ECL, HCL, and CE overlapping the second sidewall SW2 may be less than the thickness of the portion of the common layer ECL, HCL, and CE overlapping the first sidewall SW1.

In some exemplary embodiments, the common layer ECL, HCL, and CE may not overlap the transmission area TA. For example, the common layer ECL, HCL, and CE may be formed to have an open structure on the transmission area TA. In particular, since the second electrode CE of the common layer ECL, HCL, and CE has a low transmittance, removing the common layer ECL, HCL, and CE from the transmission area TA may increase a transmittance of the transparent display panel DP.

Figure 6:
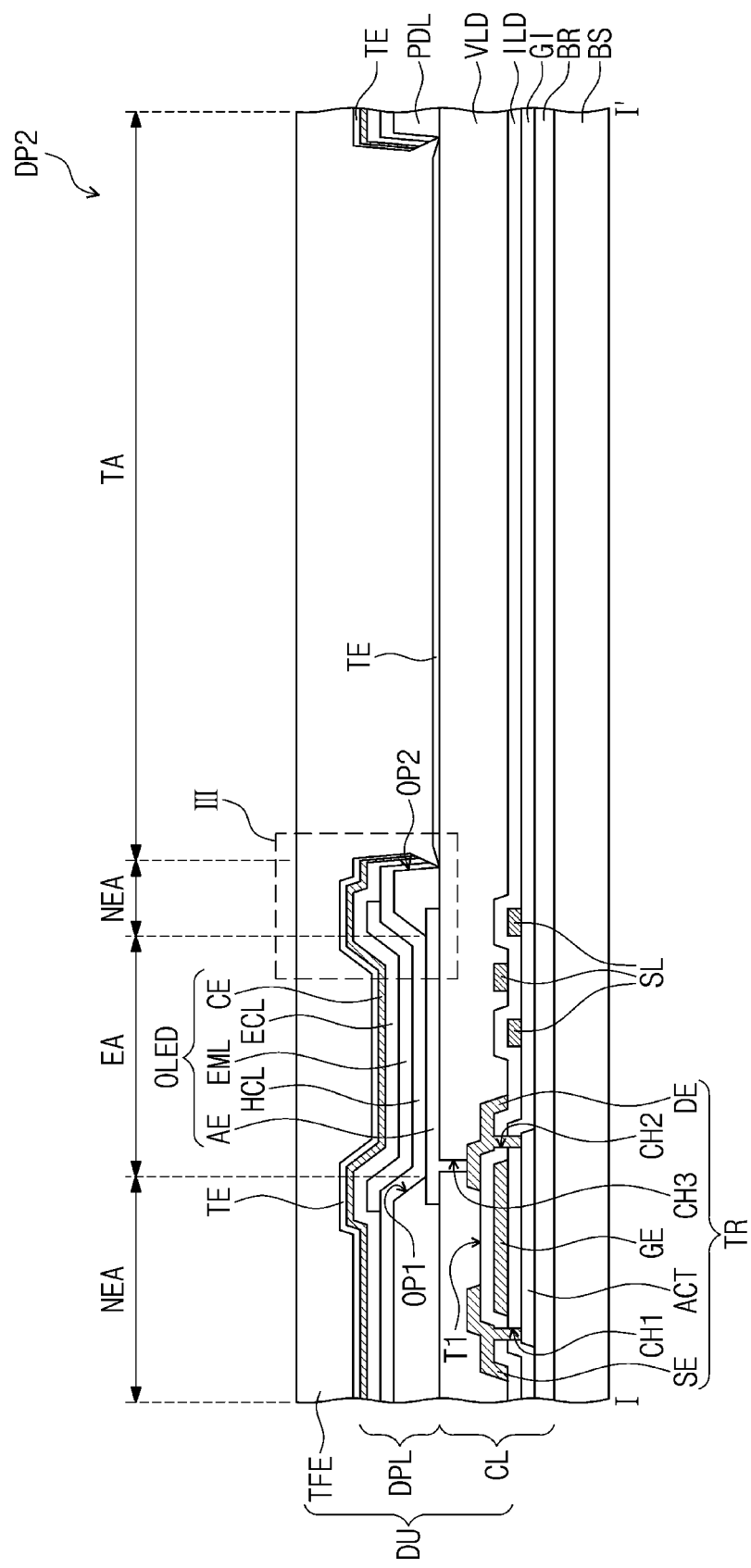
FIG. 6 is a cross-sectional view of a transparent display panel according to an exemplary embodiment.
Figure 7:
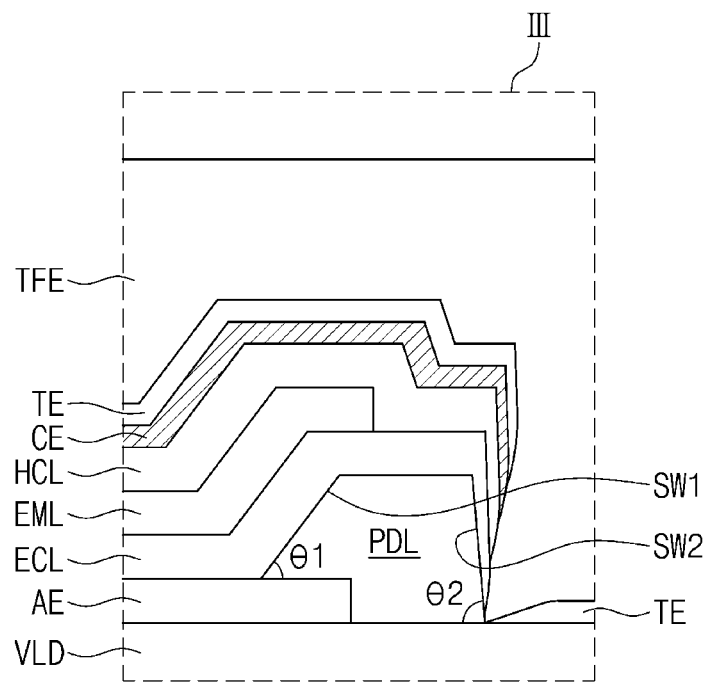
FIG. 7 is an enlarged view of section III of FIG. 6.

FIG. 6 is a cross-sectional view of a transparent display panel according to an exemplary embodiment. FIG. 7 is an enlarged view of section III of FIG. 6. The transparent display panel shown in FIGS. 6 and 7 are substantially the same as that shown in FIGS. 4 and 5, and thus, repeated descriptions of the substantially the same elements will be omitted to avoid redundancy.

Referring to FIGS. 6 and 7, a transparent display panel DP2 according an exemplary embodiment may have the display element layer DPL further provided with a third electrode TE on the second electrode CE. The third electrode TE may include a material having a transmittance of about 50% or higher. The third electrode TE may include a transparent conductive oxide, a graphene, a nano-fiber, or the like. For example, the third electrode TE may include one or more of ITO, IZO, ZnO, and $In_2O_3$.

The third electrode TE is electrically connected to the second electrode CE. The third electrode TE may be a compensation electrode for compensating a voltage drop (e.g., IR drop) caused by a reduction in thickness and area of the second electrode CE. In some exemplary embodiments, the third electrode TE may have a thickness of about 50 Å to about 500 Å.

When the third electrode TE is includes a material, such as transparent conductive oxide having high transmittance, the third electrode TE may be disposed to extend toward the transmission area TA. For example, the third electrode TE may be formed in common on the emission area EA, the non-emission area NEA, and the transmission area TA. As such, an area of the third electrode TE may be increased to improve a compensation effect for the voltage drop. In addition, since the third electrode TE has a high transmittance, even when the third electrode TE is formed to extend toward the transmission area TA, transmittance of the transparent display panel DP2 may not be reduced.

As shown in FIGS. 6 and 7, the common layer ECL, HCL, and CE and the third electrode TE may be disposed to overlap the first and second sidewalls SW1 and SW2. Since the first sidewall SW1 is sloped at the first angle θ1 and the second sidewall SW2 is sloped at the second angle θ2 greater than the first angle θ1, a thickness of the common layer ECL, HCL, and CE overlapping the second sidewall SW2 may be less than a thickness of the common layer ECL, HCL, and CE overlapping the first sidewall SW1. Likewise, a thickness of the third electrode TE overlapping the second sidewall SW2 may be less than a thickness of the third electrode TE overlapping the first sidewall SW1.

In addition, the common layer ECL, HCL, and CE does not overlap the transmission area TA. For example, the common layer ECL, HCL, and CE may have an open structure on the transmission area TA.

When the second sidewall SW2 has a steep angle or the third electrode TE has a small thickness, the third electrode TE may be removed at a boundary between the transmission area TA and the non-emission area NEA. When the third electrode TE is formed of a material having a poor step coverage, the third electrode TE may be cut at the boundary between the transmission area TA and the non-emission area NEA.

Figure 8:
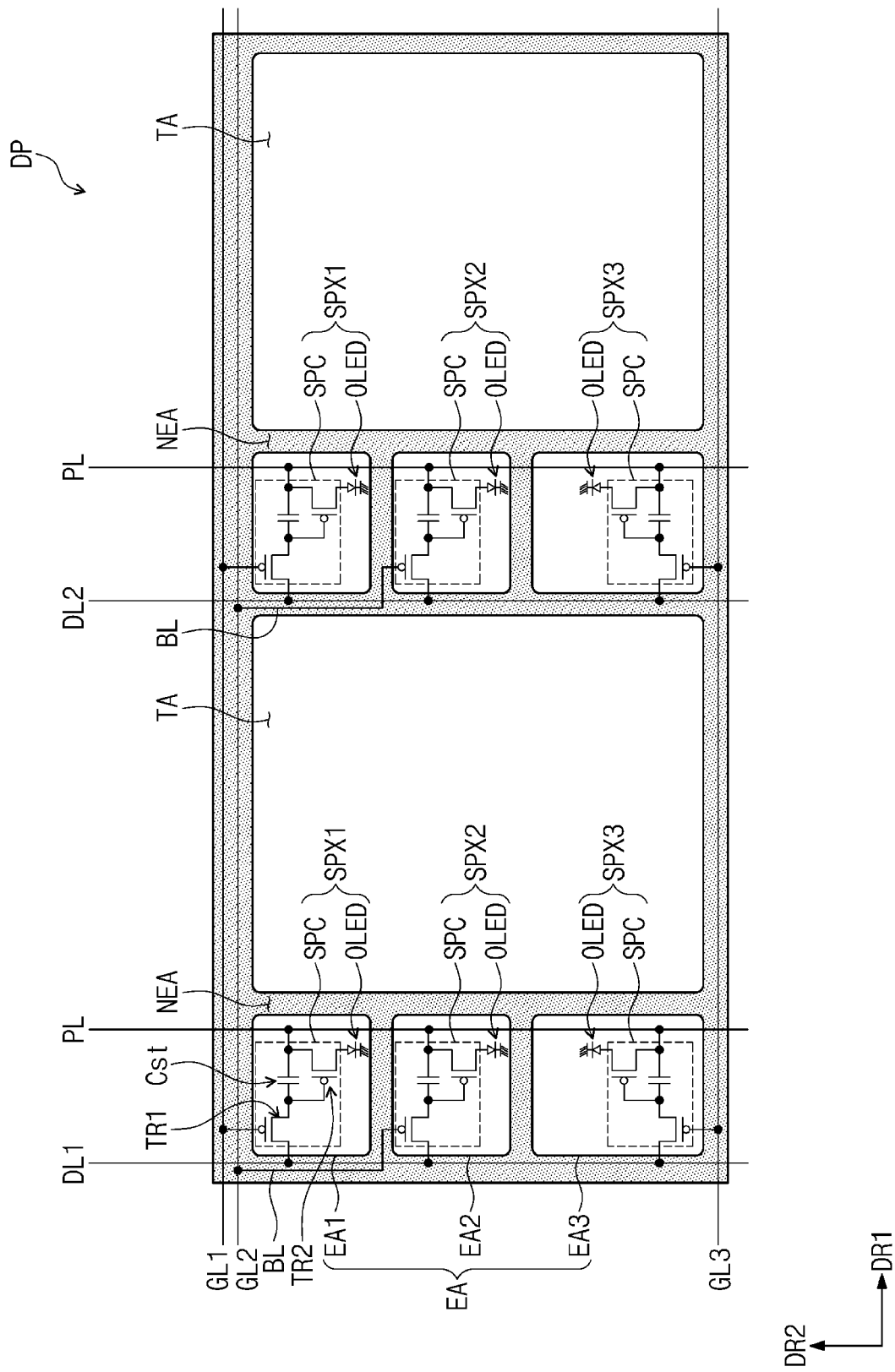
FIG. 8 is a plan view showing a circuit configuration of each pixel of a transparent display panel according to an exemplary embodiment.

FIG. 8 is a plan view of a circuit configuration of each pixel of a transparent display panel according to an exemplary embodiment.

Referring to FIG. 8, each of the pixels PX1 and PX2 includes first, second, and third sub-pixels SPX1, SPX2, and SPX3. Each of the first, second, and third sub-pixels SPX1, SPX2, and SPX3 may include a sub-pixel circuit SPC and a display element OLED. The display element OLED may be an organic light-emitting diode, and may define emission areas EA1, EA2, and EA3 on the sub-pixels SPX1, SPX2, and SPX3, respectively. The sub-pixel circuit SPC may be disposed to overlap a corresponding one of the emission areas EA1, EA2, and EA3. The sub-pixel circuit SPC may overlap the non-emission area NEA. However, the sub-pixel circuit SPC does not overlap the transmission area TA.

In some exemplary embodiments, the sub-pixel circuit SPC may include two transistors TR1 and TR2 and one capacitor Cst. However, the inventive concepts are not limited to a particular structure of the sub-pixel circuit SPC, and in some exemplary embodiments, the numbers of transistors and capacitors provided on the sub-pixel circuit SPC may be variously changed.

The signal lines SL may be electrically connected to the sub-pixel circuit SPC of each of the sub-pixels SPX1, SPX2, and SPX3. In some exemplary embodiments, the signal lines SL may include gate lines GL1, GL2, and GL3, data lines DL1, DL2, and DL3, and power voltage lines PL. Various signal lines other than the signal lines described above may be provided based on the configuration of the sub-pixel circuit SPC.

As the sub-pixel circuits SPC of the first, second, and third sub-pixels SPX1, SPX2, and SPX3 have the same circuit configuration, the sub-pixel circuit SPC will be described with reference to the one included in the first sub-pixel SPX1 of the first pixel PX1.

The sub-pixel circuit SPC of the first sub-pixel SPX1 includes a first thin film transistor TR1 connected to a first gate line GL1 and a first data line DL1, a second thin film transistor TR2 connected to the first thin film transistor TR1 and the power voltage line PL, and a capacitor Cst connected to the first thin film transistor TR1 and the second thin film transistor TR2. The first thin film transistor TR1 functions as a switching transistor, and the second thin film transistor TR2 functions as a drive transistor. The second thin film transistor TR2 is electrically connected to the first electrode AE discussed above. In FIG. 8, the first thin film transistor TR1 and the second thin film transistor TR2 are illustrated as P-types, but the inventive concepts are not limited thereto. For example, one of more of the first and second thin film transistors TR1 and TR2 may be formed as N-types. Furthermore, the numbers of thin film transistors and capacitors in the sub-pixel circuit SPC are not particularly limited, and in some exemplary embodiment, the sub-pixel circuit SPC may include two or more thin film transistors and one or more capacitors.

As shown in FIG. 8, the first gate line GL1 connected to the first sub-pixel SPX1 extends in the first direction DR1 and is disposed to overlap the non-emission area NEA. However, the present inventive concepts are not limited thereto, and in some exemplary embodiments, a portion of the first gate line GL1 may overlap the emission area EA. However, the first gate line GL1 may not overlap the transmission area TA.

A second gate line GL2 connected to the second sub-pixel SPX2 extends in the first direction DR1 and is disposed adjacent to the first gate line GL1. The second gate line GL2 may be disposed in the non-emission area NEA. The second gate line GL2 does not overlap the transmission area TA. For example, the second gate line GL2 may be disposed not to overlap the transmission area TA, but rather bypass the transmission area TA. In some exemplary embodiments, the second gate line GL2 may have a bent shape to bypass the transmission area TA. In other exemplary embodiments, the second gate line GL2 may not be bent but is substantially parallel to the first gate line GL1, as shown in FIG. 8. In this case, the transparent display panel DP may further include a bridge line BL for electrical connection between the second gate line GL2 and the second sub-pixel SPX2. The bridge line BL may not overlap the transmission area TA, but overlap the non-emission area NEA and the emission area EA.

A third gate line GL3 connected to the third sub-pixel SPX3 may extend in the first direction DR1 and be disposed spaced apart in the second direction DR2 from the first and second gate lines GL1 and GL2 across the transmission area TA. The third gate line GL3 overlaps the non-emission area NEA, but not the transmission area TA.

The first data line DL1 may be connected in common to the first to third sub-pixels SPX1 to SPX3 of the first pixel PX1, and a second data line DL2 may be connected in common to the first to third sub-pixels SPX1 to SPX3 of the second pixel PX2. The first and second data lines DL1 and DL2 overlap the non-emission area NEA, but not the transmission area TA. The power voltage line PL also overlaps the non-emission area NEA, but not the transmission area TA. As discussed above, since the signal lines GL1 to GL3, DL1, DL2, and PL are disposed neither to penetrate nor to overlap the transmission area TA, external light introduced into the transmission area TA is not reflected by the signal lines GL1 to GL3, DL1, DL2, and PL, thereof the transmittance of the transparent display panel DP may not be reduced. Accordingly, a user may clearly recognize an object or image behind the transparent display panel DP.

FIGS. 9A to 9G are cross-sectional views showing a method of manufacturing a transparent display device according to an exemplary embodiment. FIGS. 10A to 10C are enlarged cross-sectional views of section IV of FIGS. 9D to 9F, respectively.

Figure 9A:
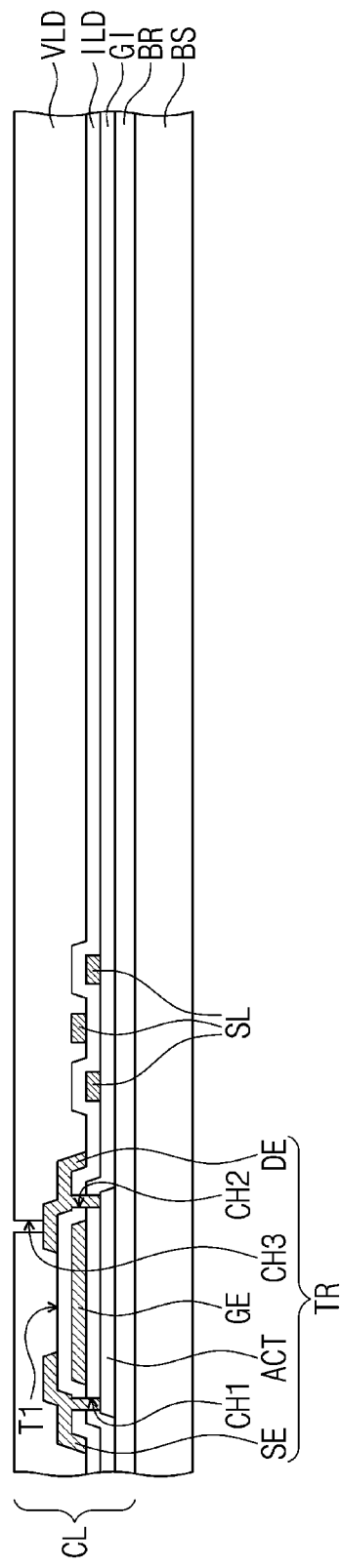
FIGS. 9A, 9B, 9C, 9D, 9E, 9F, and 9G are cross-sectional views showing a method of manufacturing a transparent display device according to an exemplary embodiment.
Figure 10A:
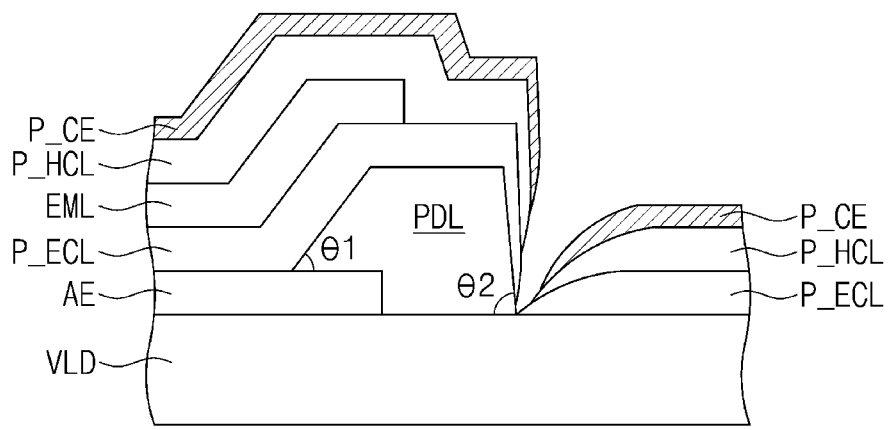
FIGS. 10A, 10B, and 10C are enlarged cross-sectional views showing section IV of FIGS. 9D to 9F, respectively.
Figure 10B:
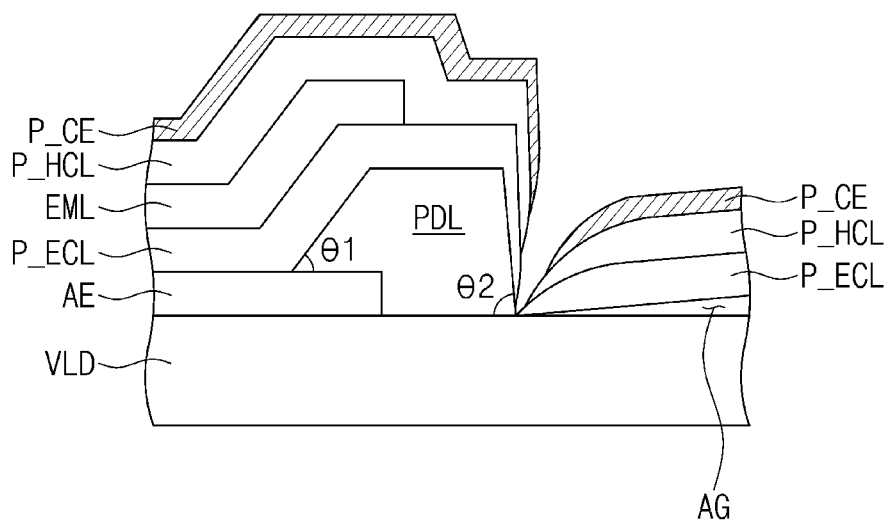
Figure 10C:
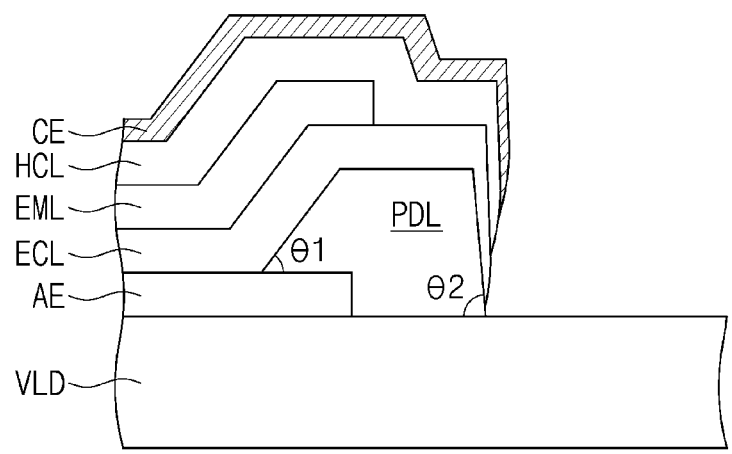

Referring to FIG. 9A, a circuit element layer CL is formed on a top surface of a base substrate BS. The circuit element layer CL may include a sub-pixel circuit provided on each sub-pixel and a plurality of signal lines SL connected to the sub-pixel circuit. A third contact hole CH3 may be formed in the circuit element layer CL, exposing an output electrode DE of a transistor TR.

FIG. 9A exemplarily shows a structure in which the circuit element layer CL is formed on each of an emission area EA, a non-emission area NEA, and a transmission area TA (see FIG. 9E), but the inventive concepts are not limited thereto. For example, in some exemplary embodiments, at least some layers included in the circuit element layer CL may be removed from the transmission area TA.

Figure 9B:
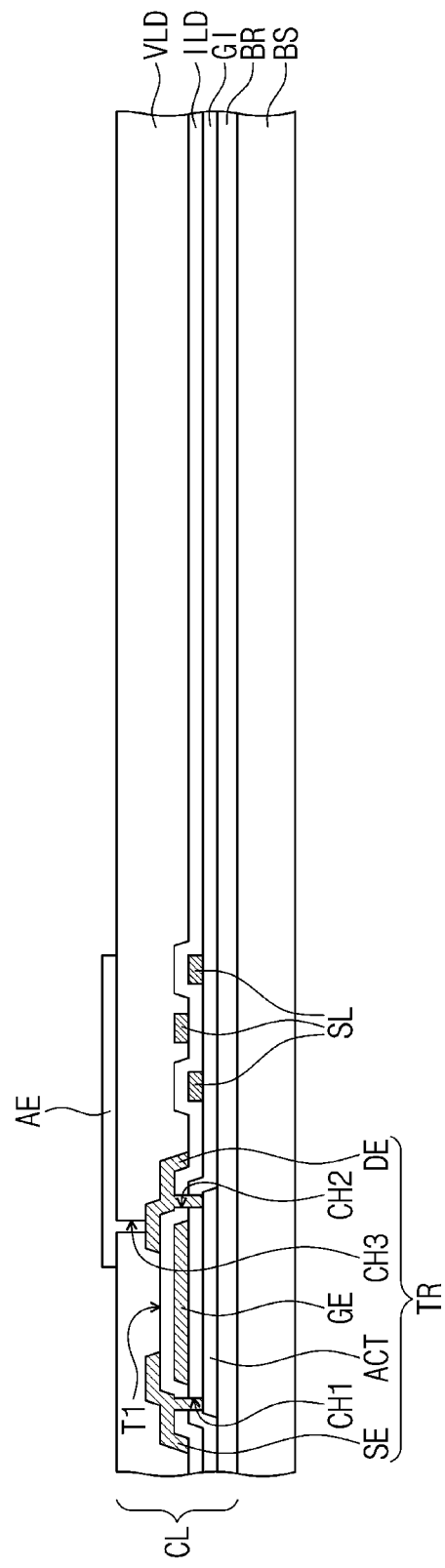

Referring to FIG. 9B, on the circuit element layer CL, a first electrode AE is formed corresponding to the emission area EA. The first electrode AE may be in contact with the output electrode DE of the transistor TR through the third contact hole CH3. The first electrode AE may include at least one of a transparent conductive material formed of ITO, IZO, ZnO, $In_2O_3$, etc., and a reflective electrode material formed of Ag, Mg, Al, Pt, Pd, Au, Ni, Nd, Ir, Cr, Li, Ca, etc. The first electrode AE may partially overlap the non-emission area NEA.

Figure 9C:
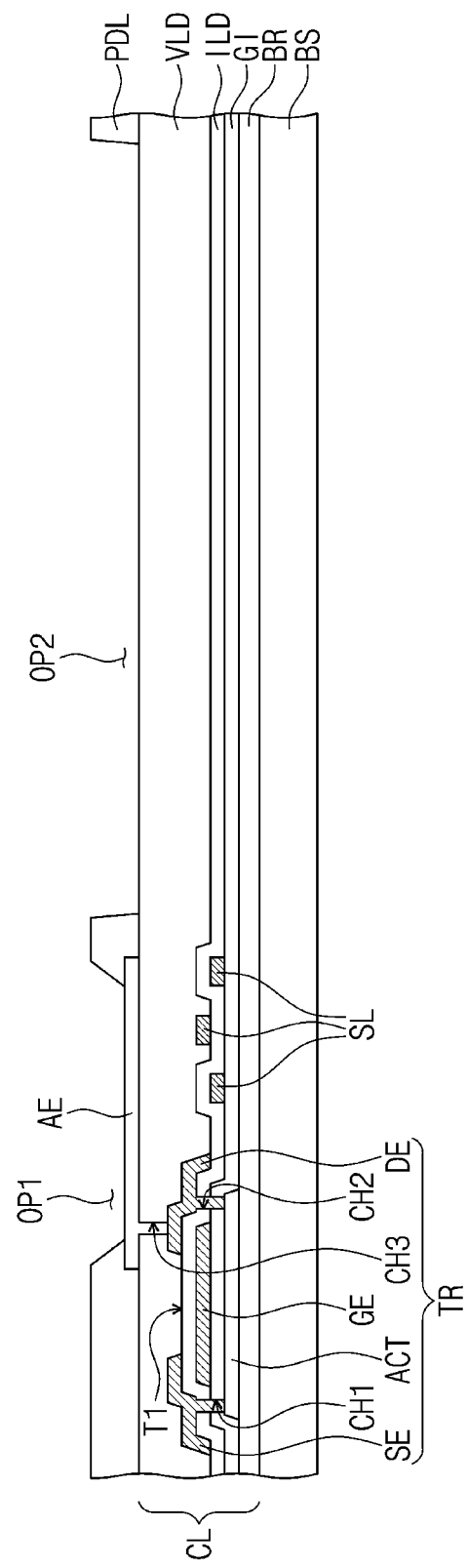

Referring to FIG. 9C, a pixel define layer PDL is formed on the circuit element layer CL and defines the emission area EA and the transmission area TA. The pixel define layer PDL may include a first opening OP1 corresponding to the emission area EA and a second opening OP2 corresponding to the transmission area TA. The first opening OP1 exposes at least a portion of the first electrode AE. A region where the first electrode AE is exposed may be defined as the emission area EA. The second opening OP2 partially exposes a top surface of the circuit element layer CL. When the circuit element layer CL is completely removed from the transmission area TA, a layer beneath the circuit element layer CL may be exposed, or when a portion of the circuit element layer CL is removed, a layer beneath the removed portion of the circuit element layer CL may be exposed.

Figure 9D:
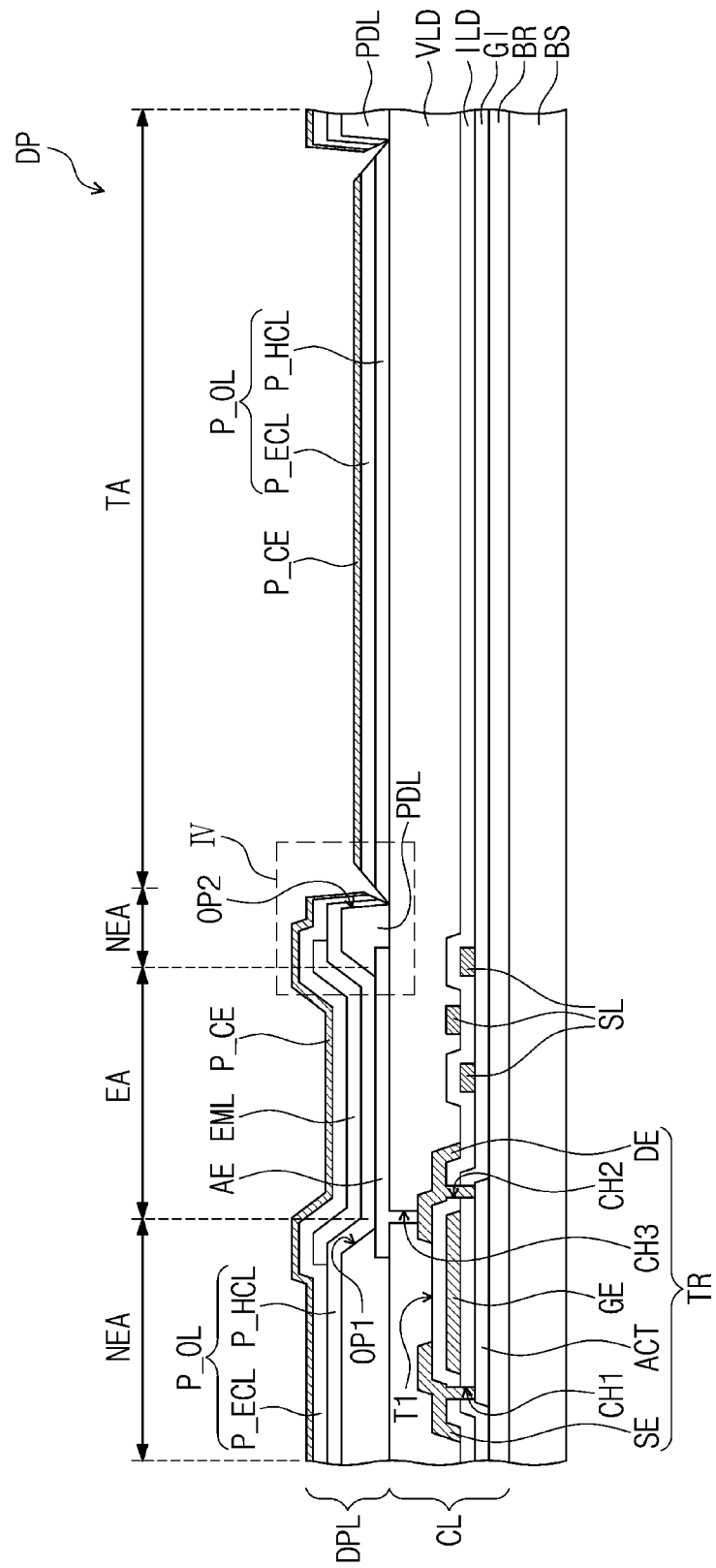

Referring to FIGS. 9D and 10A, a preliminary organic layer P_OL is formed, which may include an emission layer EML that corresponds to the emission area EA and disposed on the first electrode AE. The preliminary organic layer P_OL further includes a first preliminary organic layer P_ECL and a second preliminary organic layer P_HCL. The emission layer EML overlaps the emission area EA and the first electrode AE, while the first and second preliminary organic layers P_ECL and P_HCL overlap the emission area EA, the non-emission area NEA, and the transmission area TA. The first and second preliminary organic layers P_ECL and P_HCL may further overlap an emission area of a neighboring sub-pixel.

An electrode layer P_CE is formed on the preliminary organic layer P_OL. The electrode layer P_CE is formed to cover a top surface of the second preliminary organic layer P_HCL. The electrode layer P_CE may include a metallic material, such as Ag, Mg, Al, Pt, Pd, Au, Ni, Nd, Ir, Cr, Li, or Ca. In some exemplary embodiments, the electrode layer P_CE may be formed of Mg or an alloy thereof. For example, the electrode layer P_CE may have a thickness of about 35 Å to about 80 Å.

Figure 9E:
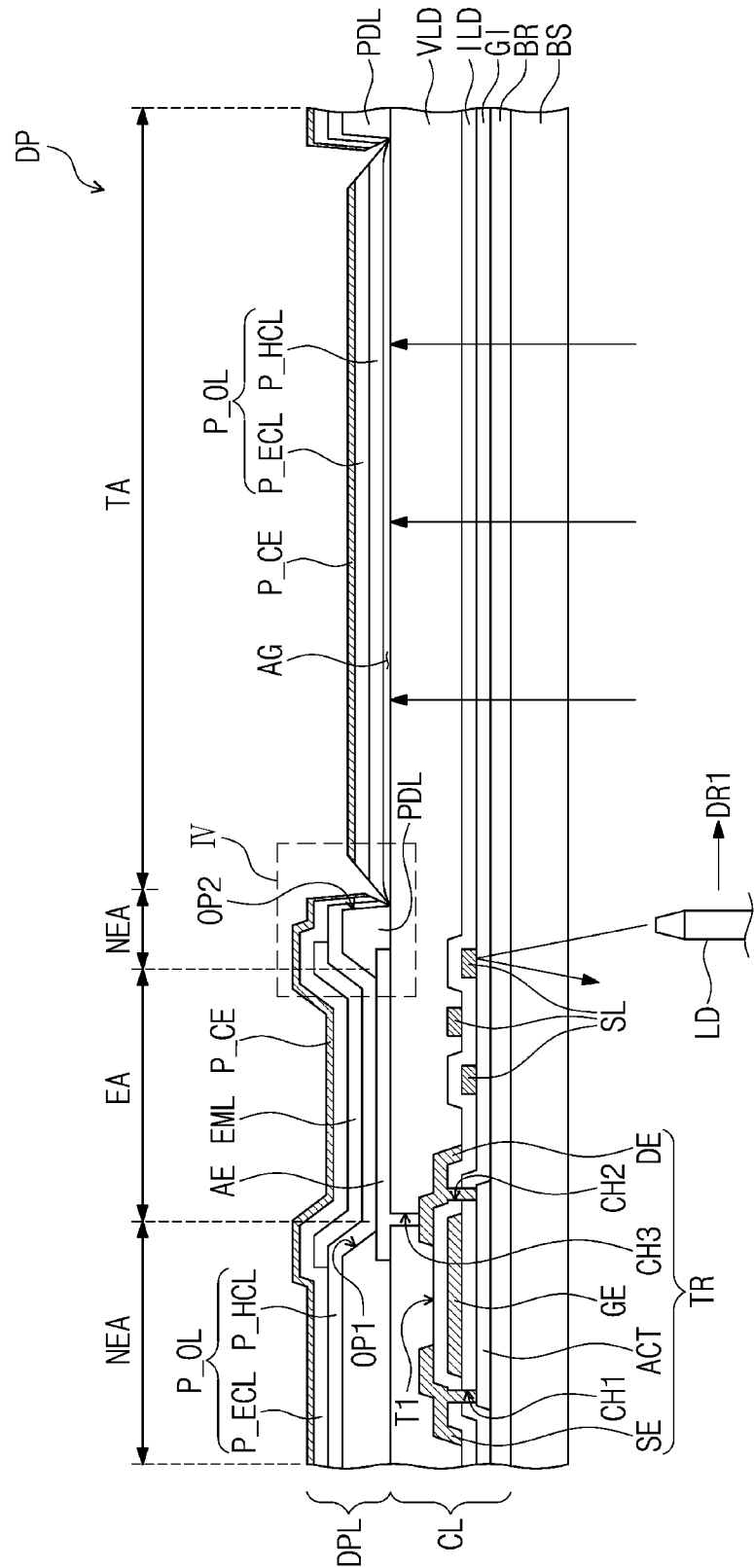

Referring to FIGS. 9E and 10B, the base substrate BS is disposed with thermal energy at a backside thereof. The process for supplying the thermal energy may be performed using a laser-induced thermal image process, a flash mask transfer lithography process, an induction heating process, or the like.

As shown in FIG. 9E, when a laser-induced thermal image process is performed after a laser apparatus LD is disposed below the backside of the base substrate BS, the laser apparatus LD may provide the preliminary organic layer P_OL with high-temperature light of about 300° C. to about 350° C., while moving in a first direction DR1. The high-temperature light may be supplied in a scanning irradiation mode, in which light is irradiated every several microseconds (μs) from the laser apparatus LD that is on the move.

On the emission area EA and the non-emission area NEA, the preliminary organic layer P_OL does not receive the high-temperature light from the laser apparatus LD because the high-temperature light is reflected by the signal lines SL, elements of the sub-pixel circuit (e.g., the transistor TR), or the first electrode AE. However, because the transmission area TA is not provided with a layer capable of reflecting the high-temperature light, the preliminary organic layer P_OL may receive the high-temperature light without being reflected. The high-temperature light supplied in the scanning irradiation mode temporarily heats up the preliminary organic layer P_OL positioned in the transmission area TA.

The preliminary organic layer P_OL includes an organic material, which has a melting point lower than that of an inorganic material. As such, the organic material is likely to be heated up by the high-temperature light that is momentarily supplied, but other layers made of an inorganic material may not be heated up due to their high melting points. A heated-up portion of the preliminary organic layer P_OL may be lifted up from the top surface of the circuit element layer CL. As such, an air gap AG may be formed between the top surface of the circuit element layer CL and the heated-up preliminary organic layer P_OL. In this manner, the heated-up portion of the preliminary organic layer P_OL by the thermal energy process may be easily separated from the circuit element layer CL.

In other exemplary embodiments, an organic material layer of the circuit element layer CL beneath the preliminary organic layer P_OL may be removed from the transmission area TA. For example, an intermediate insulating layer VLD may be opened at a portion corresponding to the transmission area TA. The process in which the intermediate insulating layer VLD is opened at a portion corresponding to the transmission area TA may be performed simultaneously with the formation of the third contact hole CH3 discussed above.

In yet other exemplary embodiments, when the intermediate insulating layer VLD is remained on the transmission area TA, the intermediate insulating layer VLD may be formed of an organic material having melting point is higher than that of the preliminary organic layer P_OL.

Figure 9F:
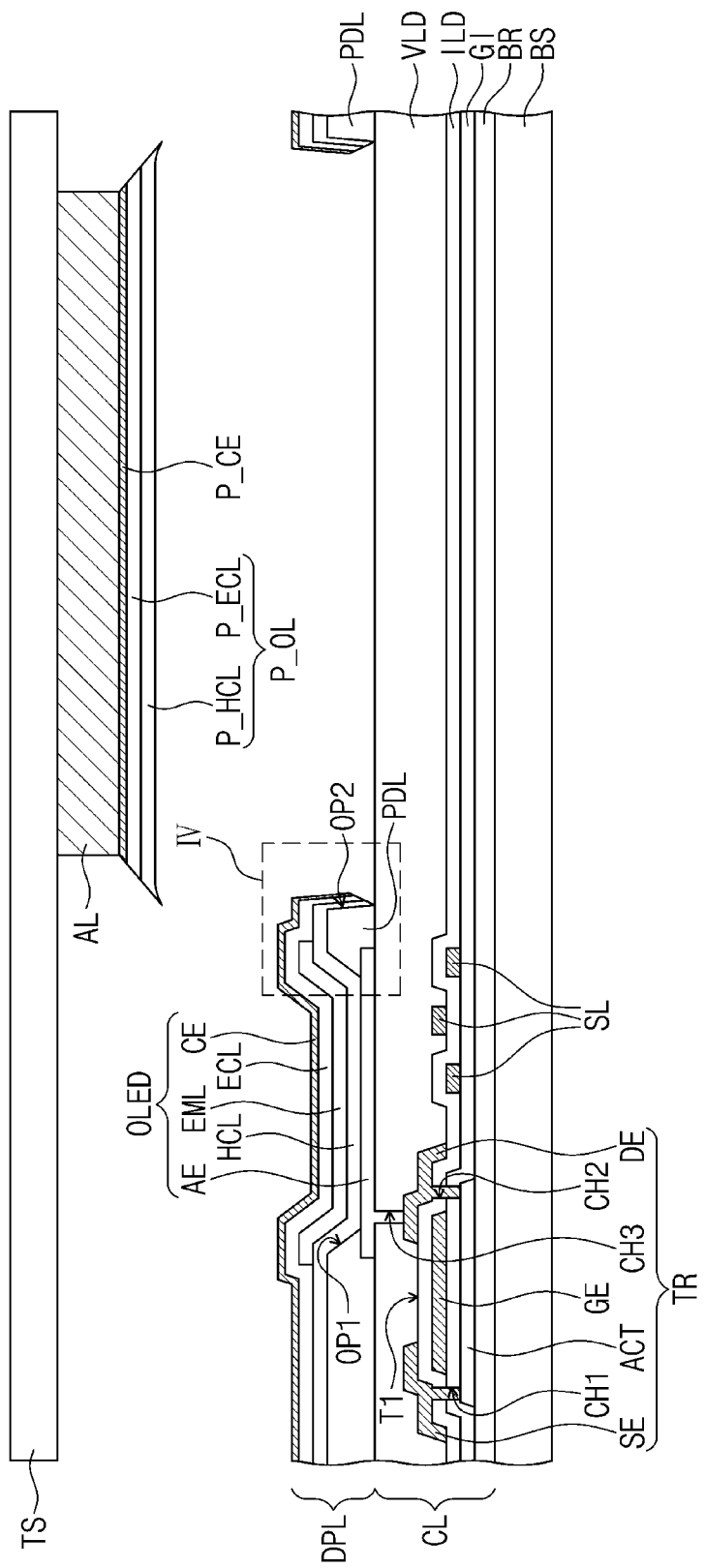

Referring to FIGS. 9F and 10C, a transfer substrate TS may be placed on the electrode layer P_CE. The transfer substrate TS may be a substrate on which an adhesive layer AL is formed in an area that corresponds to the transmission area TA. When the adhesive layer AL is disposed to correspond to the transmission area TA, the heated-up portion of the preliminary organic layer P_OL disposed on the transmission area TA may be attached to a top surface of the adhesive layer AL, and then be separated from the top surface of the circuit element layer CL as the transfer substrate TS ascends. In this manner, the heated-up portion of the preliminary organic layer P_OL may be transferred onto the transfer substrate TS.

Figure 9G:
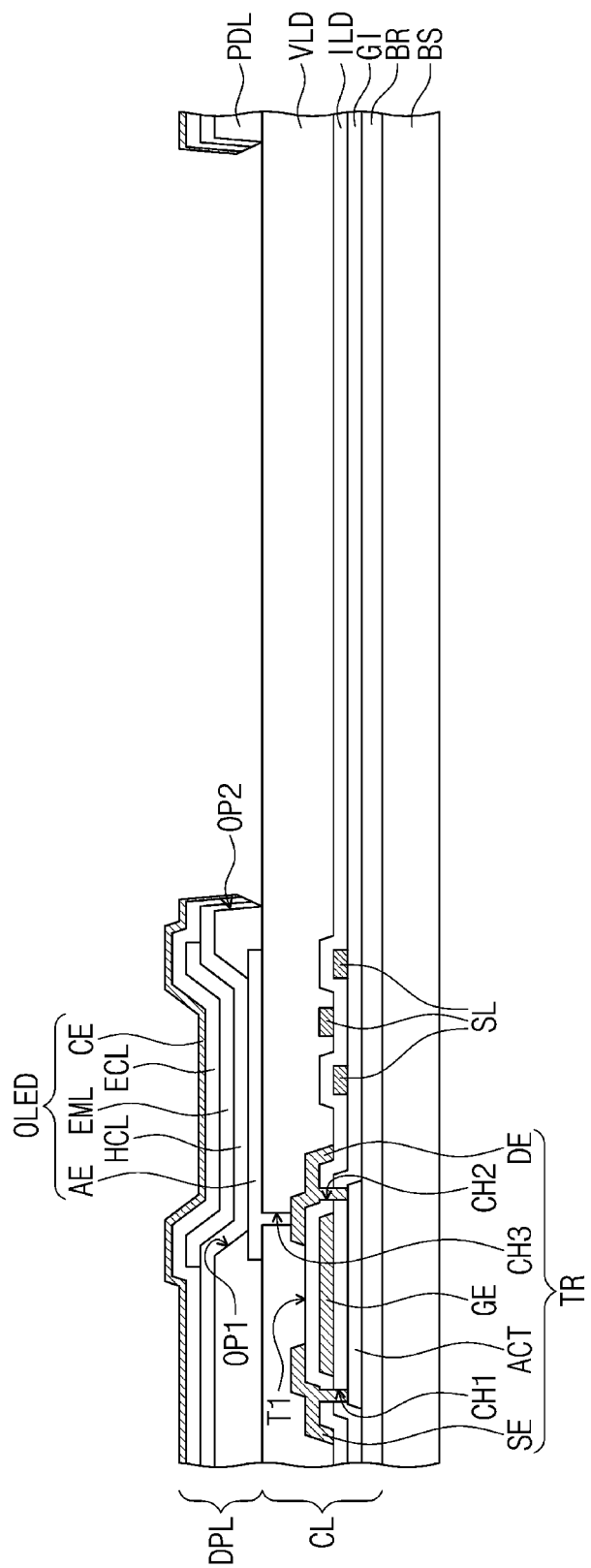

Hence, as shown in FIG. 9G, a display element layer DPL may be formed on the emission area EA and the non-emission area NEA, and be removed from the transmission area TA. Accordingly, the display element layer DPL may be provided with a transmission part that exposes the top surface of the circuit element layer CL on the transmission area TA.

Referring back to FIGS. 6 and 7, a third electrode TE may further be formed on the second electrode CE. The third electrode TE may include a material having a transmittance of 50% or higher. The third electrode TE may include a transparent conductive oxide, a graphene, a nano-fiber, or the like. For example, the third electrode TE may include one or more of ITO, IZO, ZnO, and $In_2O_3$.

The third electrode TE is electrically connected to the second electrode CE. The third electrode TE may be a compensation electrode for compensating a voltage drop (e.g., IR drop) caused by a reduction in thickness and area of the second electrode CE. In some exemplary embodiments, the third electrode TE may have a thickness of about 50 Å to about 500 Å.

When the third electrode TE is made of a material, such as transparent conductive oxide having high transmittance, the third electrode TE may be disposed to extend toward the transmission area TA. For example, the third electrode TE may be formed in common on the emission area EA, the non-emission area NEA, and the transmission area TA.

Figure 11A:
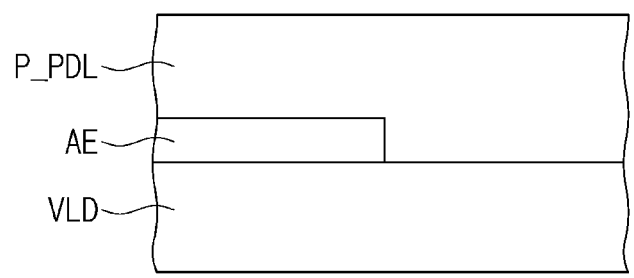
FIGS. 11A, 11B, and 11C are cross-sectional views showing a method of forming a pixel define layer of FIG. 9C.
Figure 11B:
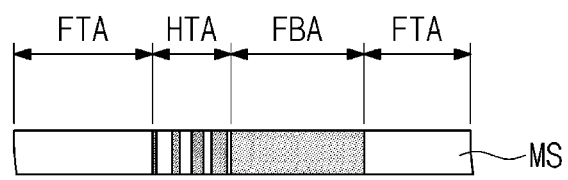
Figure 11B:
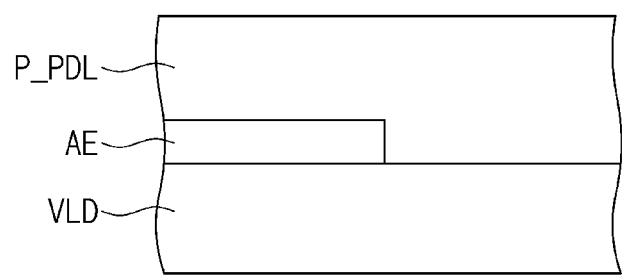
Figure 11C:
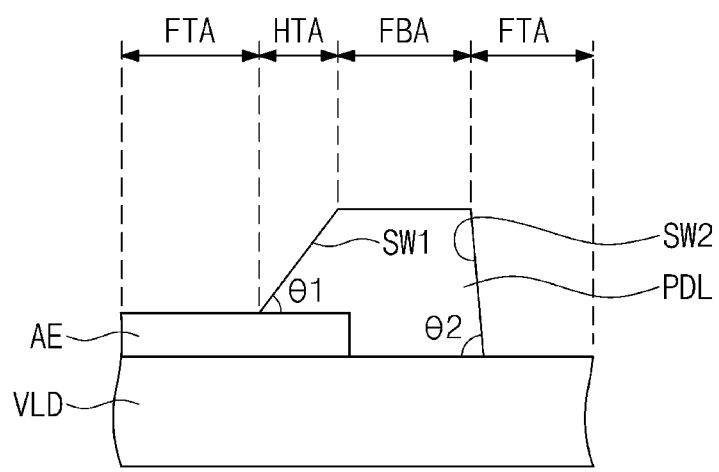

FIGS. 11A to 11C illustrate cross-sectional views showing a method of forming a pixel define layer of FIG. 9C.

Referring to FIG. 11A, the preliminary pixel define layer P_PDL is formed on the circuit element layer CL on which the first electrode AE is formed. The preliminary pixel define layer P_PDL may include a polymer resin. For example, the preliminary pixel define layer P_PDL may include a polyacrylate-based resin or a polyimide-based resin. The preliminary pixel define layer P_PDL may further include an inorganic material in addition to the polymer resin.

Referring to FIG. 11B, a photomask MS may be disposed on the preliminary pixel define layer P_PDL. The photomask MS may include a light-transmitting part FTA, a light-blocking part FBA, and a slit part HTA.

The light-transmitting part FTA is positioned to correspond to the emission area EA (see FIG. 4) and the transmission area TA (see FIG. 4), and allows provided light to pass therethrough in an exposure process using the photomask MS. As such, an exposure process may expose a portion of the preliminary pixel define layer P_PDL, portion of which corresponds to the light-transmitting part FTA. As described above, when the preliminary pixel define layer P_PDL is directly exposed to an exposure process, the preliminary pixel define layer P_PDL may include a photosensitive material.

The light-blocking part FBA is positioned to correspond to the non-emission area (see NFA of FIG. 4), and shields light provided during an exposure process. As such, the exposure process may not expose a portion of the preliminary pixel define layer P_PDL, portion of which corresponds to the light-blocking part FBA.

The slit part HTA is provided between the light-blocking part FBA and the light-transmitting part FTA. The slit part HTA is a region including a slit pattern, which causes light provided during an exposure process to have a lower transmittance than light passing through the light-transmitting part FTA. As such, an exposure process may partially expose a portion of the preliminary pixel define layer P_PDL, portion of which corresponds to the slit part HTA.

Then, when exposure and development processes remove the exposed portion of the preliminary pixel define layer P_PDL, the pixel define layer PDL is formed as shown in FIG. 11C. The partial exposure through the slit part HTA causes the pixel define layer PDL to have a first sidewall SW1 having a gentle inclination angle. For example, the first sidewall SW1 may have an inclined structure sloped at a first angle θ1 greater than 0° and equal to or less than about 30°. The pixel define layer PDL may have a second sidewall SW2, which has an inclination angle greater than that of the first sidewall SW1, at a portion directly corresponding to the light-transmitting part FTA and the light-shielding part FBA except for the slit part HTA. In some exemplary embodiments, the second sidewall SW2 may have an inclined structure sloped at a second angle θ2 greater than about 30° and less than about 90°.

According to exemplary embodiments, a common layer may be removed from a location corresponding to a transmission area, thereby increasing the transmittance in the transmission area of the transparent display device.

In addition, an inclination angle of a sidewall of a pixel define layer may be adjusted to simplify a process that removes the common layer from the location corresponding to the transmission area.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A transparent display device comprising a base substrate and a plurality of pixels disposed on the base substrate, each pixel having an emission area and a transmission area transparent to external light, each of the pixels comprising:
    a circuit element layer disposed on the base substrate;
    a first electrode disposed on the circuit element layer and corresponding to the emission area;
    a pixel define layer disposed on the circuit element layer, the pixel define layer including a first sidewall defining the emission area and a second sidewall defining the transmission area;
    an emission layer disposed on the first electrode and corresponding to the emission area; and
    a second electrode disposed on the emission layer and including an opening that corresponds to the transmission area,
    wherein the first sidewall is inclined at a first angle, and
    wherein the second sidewall is inclined at a second angle greater than the first angle.

2. The transparent display device of claim 1, wherein:
    the first angle of the first sidewall is greater than 0° and equal to or less than about 30°; and
    the second angle of the second sidewall is greater than about 30° and less than about 90°.

3. The transparent display device of claim 1, wherein the second electrode has a thickness of about 35 Å to about 80 Å.

4. The transparent display device of claim 1, further comprising:
    a first organic layer disposed between the first electrode and the emission layer, corresponding to the emission area, and having an opening in the transmission area; and
    a second organic layer disposed between the emission layer and the second electrode, corresponding to the emission area, and having an opening in the transmission area.

5. The transparent display device of claim 1, further comprising a third electrode disposed on the second electrode and corresponding to the emission area.

6. The transparent display device of claim 5, wherein the third electrode includes a material having a transmittance of at least 50%, and is disposed to extend toward the transmission area.

7. The transparent display device of claim 6, wherein the third electrode has a thickness of about 50 Å to about 500 Å.

8. The transparent display device of claim 1, wherein:
    each of the pixels has a plurality of sub-pixels; and
    the emission area includes a plurality of emission areas that respectively correspond to the plurality of sub-pixels.

9. The transparent display device of claim 8, wherein the circuit element layer includes:
    a sub-pixel circuit disposed on the plurality of emission areas; and
    a plurality of signal lines connected to the sub-pixel circuit.

10. The transparent display device of claim 9, wherein the plurality of signal lines do not overlap the transmission area.

* * * * *